United States Patent
Nasher (10) Patent No.: US 9,884,342 B2
(45) Date of Patent: Feb. 6, 2018

(54) TECHNIQUES FOR MARKING PRODUCT HOUSINGS

(75) Inventor: Michael Nasher, San Jose, CA (US)

(73) Assignee: APPLE INC., Cupertino, CA (US)

( * ) Notice: Subject to any disclaimer, the term of this patent is extended or adjusted under 35 U.S.C. 154(b) by 733 days.

(21) Appl. No.: 12/569,810

(22) Filed: Sep. 29, 2009

(65) Prior Publication Data

US 2010/0294426 A1 Nov. 25, 2010

Related U.S. Application Data (60) Provisional application No. 61/179,588, filed on May 19, 2009.

(51) Int. Cl.
| | | |
|---|---|---|
| *B05D 5/06* | (2006.01) | |
| *H05K 5/02* | (2006.01) | |
| *B05D 1/32* | (2006.01) | |
| *B05D 7/00* | (2006.01) | |

(52) U.S. Cl.
CPC ............... *B05D 5/06* (2013.01); *B05D 5/061* (2013.01); *H05K 5/0243* (2013.01); *B05D 1/32* (2013.01); *B05D 7/53* (2013.01)

(58) Field of Classification Search
USPC ............ 156/272.2, 272.8, 273.3; 427/558; 430/269, 270.1, 311, 315
See application file for complete search history.

(56) References Cited

U.S. PATENT DOCUMENTS

| | | |
|---|---|---|
| 2,647,079 A | 7/1953 | Burnham |
| 3,526,694 A | 9/1970 | Lemelson |
| 3,645,777 A | 2/1972 | Sierad |
| 4,247,600 A | 1/1981 | Adachi et al. |
| 4,269,947 A | 5/1981 | Inata et al. |
| 4,531,705 A | 7/1985 | Nakagawa et al. |
| 4,547,649 A | 10/1985 | Butt et al. |

(Continued)

FOREIGN PATENT DOCUMENTS

| | | |
|---|---|---|
| CN | 1362125 A | 8/2002 |
| CN | 1306526 C | 3/2007 |

(Continued)

OTHER PUBLICATIONS

"Thermal Shock Resistant Conformal Coating", Product Data Sheet, Dymax Corporation, Jul. 9, 2007, pp. 1-2.

(Continued)

*Primary Examiner* — Daniel McNally
(74) *Attorney, Agent, or Firm* — Brownstein Hyatt Farber Schreck, LLP (57) ABSTRACT

Techniques or processes for providing markings on products are disclosed. The markings provided on products can be textual and/or graphic. The techniques or processes can provide high resolution markings on surfaces that are flat or curved. In one embodiment, the products have housings and the markings are to be provided on the housings. For example, the housing for a particular product can include an outer housing surface and the markings can be provided on the outer housing surface. The markings can be formed using a ultra-violet (UV) curable material that can be selectively cured on a surface (e.g., housing surface) in places where markings, namely text and/or graphics, are to be provided.

18 Claims, 6 Drawing Sheets

(56) References Cited

U.S. PATENT DOCUMENTS

| | | | |
|---|---|---|---|
| 4,564,001 A | | 1/1986 | Maeda |
| 4,754,418 A | * | 6/1988 | Hara ................. 361/679.56 |
| 4,925,705 A | * | 5/1990 | Hill ...................... 427/259 |
| 4,931,366 A | | 6/1990 | Mullaney |
| 4,993,148 A | | 2/1991 | Adachi et al. |
| 5,417,905 A | | 5/1995 | Lemaire et al. |
| 5,808,268 A | | 9/1998 | Balz |
| 5,824,715 A | * | 10/1998 | Hayashihara ......... B41M 5/30 347/139 |
| 5,837,086 A | | 11/1998 | Leeb et al. |
| 5,872,699 A | | 2/1999 | Nishii et al. |
| 5,925,847 A | | 7/1999 | Rademacher et al. |
| 5,971,617 A | | 10/1999 | Woelki et al. |
| 6,007,929 A | | 12/1999 | Robertson et al. |
| 6,101,372 A | | 8/2000 | Kubo |
| 6,169,266 B1 | | 1/2001 | Hughes |
| 6,331,239 B1 | | 12/2001 | Shirota et al. |
| 6,480,397 B1 | | 11/2002 | Hsu et al. |
| 6,540,667 B2 | | 4/2003 | Cochran |
| 6,574,096 B1 | | 6/2003 | Difonzo et al. |
| 6,590,183 B1 | | 7/2003 | Yeo |
| 6,633,019 B1 | | 10/2003 | Gray |
| 6,746,724 B1 | | 6/2004 | Robertson et al. |
| 6,852,948 B1 | * | 2/2005 | Harrison ............... B41M 5/262 219/121.85 |
| 6,966,133 B2 | | 11/2005 | Krings et al. |
| 6,996,425 B2 | | 2/2006 | Watanabe |
| 7,134,198 B2 | | 11/2006 | Nakatani et al. |
| 7,181,172 B2 | | 2/2007 | Sullivan et al. |
| 7,225,529 B2 | | 6/2007 | Wang |
| 7,459,373 B2 | | 12/2008 | Yoo |
| 7,530,491 B2 | | 5/2009 | Lasch et al. |
| 7,622,183 B2 | | 11/2009 | Shirai et al. |
| 7,636,974 B2 | | 12/2009 | Meschter et al. |
| 7,691,189 B2 | | 4/2010 | En et al. |
| 8,192,815 B2 | | 6/2012 | Weber et al. |
| 8,367,304 B2 | | 2/2013 | Heley et al. |
| 8,379,678 B2 | | 2/2013 | Zhang et al. |
| 8,379,679 B2 | | 2/2013 | Zhang et al. |
| 2002/0058737 A1 | * | 5/2002 | Nishiwaki et al. ........... 524/431 |
| 2002/0097440 A1 | | 7/2002 | Paricio et al. |
| 2002/0109134 A1 | | 8/2002 | Iwasaki et al. |
| 2002/0130441 A1 | | 9/2002 | Robinson et al. |
| 2002/0160145 A1 | | 10/2002 | Bauhoff |
| 2003/0006217 A1 | | 1/2003 | Dance |
| 2003/0024898 A1 | | 2/2003 | Natsume et al. |
| 2004/0000490 A1 | | 1/2004 | Chang |
| 2005/0023022 A1 | | 2/2005 | Kriege et al. |
| 2005/0034301 A1 | | 2/2005 | Wang |
| 2005/0115840 A1 | | 6/2005 | Dolan |
| 2005/0158576 A1 | | 7/2005 | Groll |
| 2005/0211680 A1 | | 9/2005 | Li et al. |
| 2005/0224169 A1 | * | 10/2005 | Flosbach et al. ........... 156/275.5 |
| 2005/0263418 A1 | | 12/2005 | Bastus |
| 2006/0055084 A1 | | 3/2006 | Yamaguchi et al. |
| 2006/0066771 A1 | | 3/2006 | Hayano et al. |
| 2006/0105542 A1 | | 5/2006 | Yoo |
| 2007/0018817 A1 | | 1/2007 | Marmaropoulos et al. |
| 2007/0045893 A1 | | 3/2007 | Asthana et al. |
| 2007/0053504 A1 | | 3/2007 | Sato et al. |
| 2007/0262062 A1 | | 11/2007 | Guth |
| 2007/0275263 A1 | | 11/2007 | Groll |
| 2008/0216926 A1 | | 9/2008 | Guo et al. |
| 2008/0241478 A1 | | 10/2008 | Costin et al. |
| 2008/0299408 A1 | | 12/2008 | Guo et al. |
| 2008/0311369 A1 | | 12/2008 | Yokoyama et al. |
| 2009/0017242 A1 | | 1/2009 | Weber et al. |
| 2009/0104949 A1 | | 4/2009 | Sato et al. |
| 2009/0190290 A1 | | 7/2009 | Lynch et al. |
| 2009/0194444 A1 | | 8/2009 | Jones |
| 2009/0236143 A1 | | 9/2009 | Nakamura |
| 2009/0260871 A1 | | 10/2009 | Weber et al. |
| 2009/0305168 A1 | | 12/2009 | Heley et al. |
| 2010/0065313 A1 | | 3/2010 | Takeuchi et al. |
| 2010/0159273 A1 | | 6/2010 | Filson et al. |
| 2010/0209721 A1 | | 8/2010 | Irikura et al. |
| 2010/0300909 A1 | | 12/2010 | Hung |
| 2011/0008618 A1 | | 1/2011 | Weedlun |
| 2011/0048755 A1 | | 3/2011 | Su et al. |
| 2011/0051337 A1 | | 3/2011 | Weber et al. |
| 2011/0193928 A1 | | 8/2011 | Zhang et al. |
| 2011/0193929 A1 | | 8/2011 | Zhang et al. |
| 2011/0194574 A1 | | 8/2011 | Zhang et al. |
| 2011/0253411 A1 | | 10/2011 | Hum et al. |
| 2011/0315667 A1 | | 12/2011 | Reichenback et al. |
| 2012/0043306 A1 | | 2/2012 | Howerton et al. |
| 2012/0100348 A1 | | 4/2012 | Brokhyser et al. |
| 2012/0248001 A1 | | 10/2012 | Nashner |
| 2012/0250250 A1 | | 10/2012 | Tatebe |
| 2012/0275130 A1 | | 11/2012 | Hsu et al. |

FOREIGN PATENT DOCUMENTS

| | | |
|---|---|---|
| DE | 195 23 112 | 6/1996 |
| DE | 102005048870 A1 | 4/2007 |
| EP | 0 114 565 A1 | 8/1984 |
| EP | 0 633 585 A | 1/1995 |
| EP | 0 997 958 A1 | 5/2000 |
| EP | 2 399 740 A1 | 12/2011 |
| GB | 788 329 A | 12/1957 |
| JP | 03 013331 A | 1/1991 |
| JP | 03 138131 A | 6/1991 |
| JP | 04173299 A * | 6/1992 |
| JP | 06-126192 | 5/1994 |
| JP | 2000-000167 | 1/2000 |
| JP | 2008 087409 A | 4/2008 |
| WO | WO 98/53451 | 11/1998 |
| WO | WO 0077883 | 12/2000 |
| WO | WO 01/15916 A1 | 3/2001 |
| WO | WO 01/34408 | 5/2001 |
| WO | WO 2006/124279 A2 | 11/2006 |
| WO | WO 2008/092949 A1 | 8/2008 |
| WO | WO 2009/051218 A1 | 4/2009 |
| WO | WO 2010/095747 A1 | 8/2010 |

OTHER PUBLICATIONS

"Marking Lasers: Marking without Limitations", Trumpf Inc., Sep. 10, 2007, pp. 1-36.

Annerfors et al., "Nano Molding Technology on Cosmetic Aluminum Parts in Mobile Phones", Division of Production and Materials Engineering, LTH, 2007.

"UV-Curing Sheet Adhesives", ThreeBond Technical News, Issued Jul. 1, 2009, 8 pages.

Chang, "Lasers Make Other Metals Look Like Gold", New York Times, nytimes.com, 2 pgs., Jan. 31, 2008.

"Database EPI" Week 201107 Thomas Scientific, London, GB; AN 2010-Q46184, Nov. 17, 2010, 1 pg.

* cited by examiner

TECHNIQUES FOR MARKING PRODUCT HOUSINGS

CROSS-REFERENCE TO RELATED APPLICATION

This application claims priority benefit of U.S. Provisional Application No. 61/179,588, filed May 19, 2009 and entitled "TECHNIQUES FOR MARKING PRODUCT HOUSINGS," which is hereby incorporated herein by reference.

BACKGROUND OF THE INVENTION

Field of the Invention

The present invention relates to marking products and, more particularly, marking outer housing surfaces of electronic devices.

Description of the Related Art

Consumer products, such as electronic devices, have been marked with various information for many years. For example, it is common for electronic devices to be marked with a serial number, model number, copyright information and the like. Conventionally, such markings are done with an ink printing or stamping process. Although conventional ink printing and stamping is useful for many situations, such techniques can be inadequate in the case of handheld electronic devices. The small form factor of handheld electronic devices, such as mobile phones, portable media players and Personal Digital Assistants (PDAs), requires that the markings be very small. In order for such small markings to be legible, the markings must be accurately and precisely formed. Unfortunately, however, conventional techniques are not able to offer sufficient accuracy and precision. Thus, there is a need for improved techniques to mark products.

SUMMARY OF THE INVENTION

The invention pertains to techniques or processes for providing markings on products. The markings provided on products can be textual and/or graphic. The techniques or processes can provide high resolution markings on surfaces that are flat or curved. In one embodiment, the products have housings and the markings are to be provided on the housings. For example, the housing for a particular product can include an outer housing surface and the markings can be provided on the outer housing surface. The products can, in one embodiment, pertain to electronic devices, such as portable electronic device (e.g., handheld electronic devices).

In general, markings, or annotations, provided on products according to the invention can be textual and/or graphic. The markings can be provided in one color or multiple colors. The marking of a product can be used to provide the product (e.g., a product's housing) with certain information. The marking can, for example, be use to label the product with various information. When a marking includes text, the text can provide information concerning the product (e.g., electronic device). For example, the text can include one or more of: name of product, trademark or copyright information, design location, assembly location, model number, serial number, license number, agency approvals, standards compliance, electronic codes, memory of device, and the like. When a marking includes a graphic, the graphic can pertain to a logo, a certification mark, standards mark or an approval mark. The markings can be used for advertisements to be provided on products. The markings can also be used for customization (e.g., user customization) of product housings (e.g., customized external appearance via markings).

One aspect of the invention provides product markings using an ultra-violet (UV) curable material. Here, a UV curable material can be placed on a product surface, and then selectively cured on the product surface in places where markings, namely text and/or graphics, are to be provided. Subsequently, remaining UV curable material at the product surface that has not been cured can be removed such that the product surface thereafter includes the text and/or graphics for the product marking. The product marking process according to the invention is suitable for use on flat, curved or complex surfaces.

The invention can be implemented in numerous ways, including as a method, system, device, or apparatus. Several embodiments of the invention are discussed below.

As a method for depositing material to selected regions of an electronic device housing, one embodiment can, for example, include at least: depositing a layer of UV curable material onto a housing surface of the electronic device housing; curing select portions of the layer of UV curable material that are desired to remain on the outer surface housing; and removing remaining portions of the layer of UV curable material that have not been cured by said curing.

As a method for depositing material to selected regions of an electronic device housing, another embodiment can, for example, include at least: forming a mask layer having at least one predetermined opening; adhering the mask layer to a housing surface of the electronic device housing; depositing a layer of UV curable material onto the housing surface, the layer of UV curable material being provided on the housing surface at least within the predetermined opening of the mask layer; removing the mask layer from the outer surface housing; curing select portions of the layer of UV curable material that are desired to remain on the outer surface housing; and removing remaining portions of the layer of UV curable material that have not been cured by said curing.

As a method for depositing material to selected regions of an electronic device housing, another embodiment can, for example, include at least: depositing a layer of UV curable material onto a housing surface of the electronic device housing; and directing UV light from a UV laser onto select portions of the layer of UV curable material on the housing surface to thereby cure the select portions of the of the layer of UV curable material that are to remain on the outer surface housing. Optionally, the method can further remove any portions of the layer of UC curable material that have not been cured, and apply a translucent protective layer to the housing surface so as to cover at least the select portions of the layer of UV curable material that have been cured on the housing surface.

As a method for labeling a product, one embodiment can, for example, include at least: depositing a layer of UV curable material onto a surface of the product to be labeled; curing select portions of the layer of UV curable material that are desired to remain on the surface of the product; and removing from the surface of the product remaining portions of the layer of UV curable material that have not been cured by said curing.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION OF THE INVENTION

The invention pertains to techniques or processes for providing markings on products. The markings provided on products can be textual and/or graphic. The techniques or processes can provide high resolution markings on surfaces that are flat or curved. In one embodiment, the products have housings and the markings are to be provided on the housings. For example, the housing for a particular product can include an outer housing surface and the markings can be provided on the outer housing surface. The products can, in one embodiment, pertain to electronic devices, such as portable electronic device (e.g., handheld electronic devices).

In general, markings, or annotations, provided on products according to the invention can be textual and/or graphic. The markings can be provided in one color or multiple colors. The marking of a product can be used to provide the product (e.g., a product's housing) with certain information. The marking can, for example, be use to label the product with various information. When a marking includes text, the text can provide information concerning the product (e.g., electronic device). For example, the text can include one or more of: name of product, trademark or copyright information, design location, assembly location, model number, serial number, license number, agency approvals, standards compliance, electronic codes, memory of device, and the like. When a marking includes a graphic, the graphic can pertain to a logo, a certification mark, standards mark or an approval mark. The markings can be used for advertisements to be provided on products. The markings can also be used for customization (e.g., user customization) of product housings (e.g., customized external appearance via markings).

One aspect of the invention provides product markings using an ultra-violet (UV) curable material. Here, a UV curable material can be placed on a product surface, and then selectively cured on the product surface in places where markings, namely text and/or graphics, are to be provided. Subsequently, remaining UV curable material at the product surface that has not been cured can be removed such that the product surface thereafter includes the text and/or graphics for the product marking. The product marking process according to the invention is suitable for use on flat, curved or complex surfaces.

Embodiments of the invention are discussed below with reference to FIGS. 1-5B. However, those skilled in the art will readily appreciate that the detailed description given herein with respect to these figures is for explanatory purposes as the invention extends beyond these limited embodiments.

Figure 1:
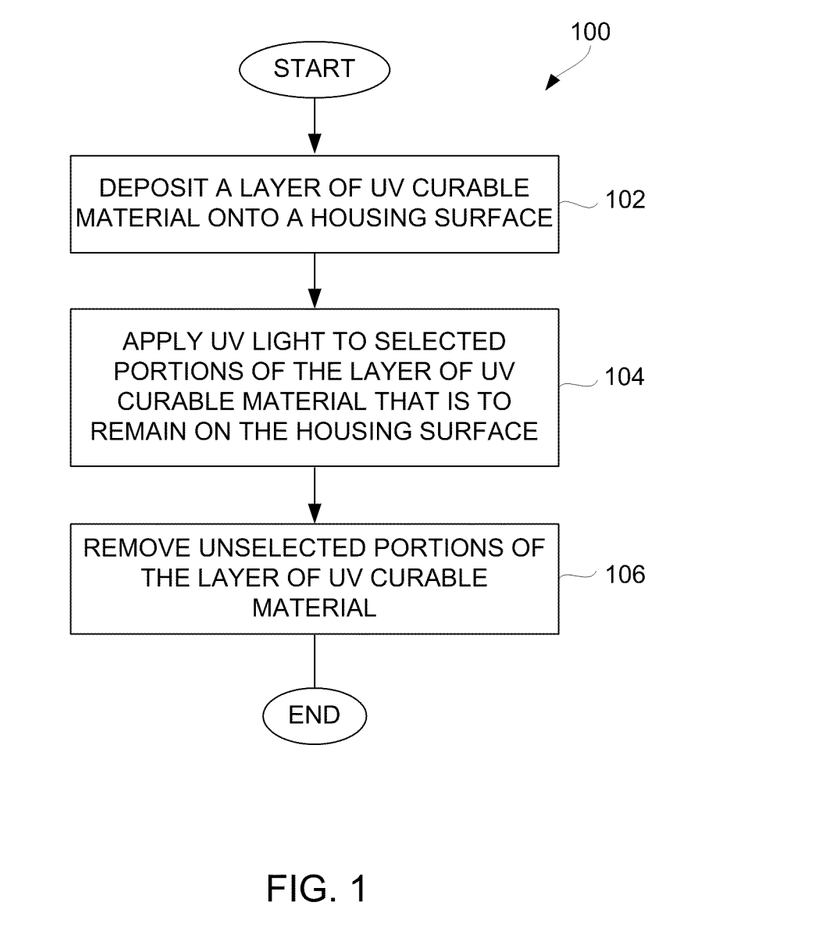
FIG. 1 is a process flow diagram for product marking process according to one embodiment of the invention.

FIG. 1 is a process flow diagram for product marking process 100 according to one embodiment of the invention. The product marking process 100 is, for example, suitable for applying text or graphics to a housing surface (e.g., an outer housing surface) of a product. For example, the product can be an electronic device. The product marking process 100 is, in one embodiment, particularly well-suited for applying text and/or graphics to an outer housing surface of a portable electronic device, such as a handheld electronic device. Examples of handheld electronic devices include mobile telephones (e.g., cell phones), Personal Digital Assistants (PDAs), portable media players, remote controllers, pointing devices (e.g., computer mouse), game controllers, etc.

Initially, the product marking process 100 deposits 102 a layer of ultra-violet (UV) curable material onto a housing surface of a product. In one embodiment, the UV curable material can be adhesive material that can be applied to the outer housing surface as a further layer. The housing surface can be flat or curved. Next, a UV light can be applied 104 to selected portions of the layer of UV curable material that is to remain on the housing surface. Here, the UV light is applied 104 so as to cure the selected portions of the UV curable material. As a result, the selected portions of the UV curable material are cured and thus become firmly adhered to the housing surface. Thereafter, the unselected portions of the layer of UV curable material can be removed 106 from the housing surface. Since the unselected portions of the UV curable material have not been cured, such unselected portions have not firmly adhered to the housing surface. As a result, through use of a fluid (e.g., water, solution, dissolvent), the unselected portions of the UV curable material can be removed from the housing surface, while the selected portions of the UV curable material that have been cured can remain adhered to the housing surface.

Consequently, the product marking process 100 serves to mark the housing surface of the product through use of selected potions of the UV curable material. The markings provided by the product marking process 100 can be text and/or graphics. For example, a graphic provided by the marking might pertain to a logo, a certification mark or an approval mark. The markings can also be durable and have a high resolution.

Figure 2A:
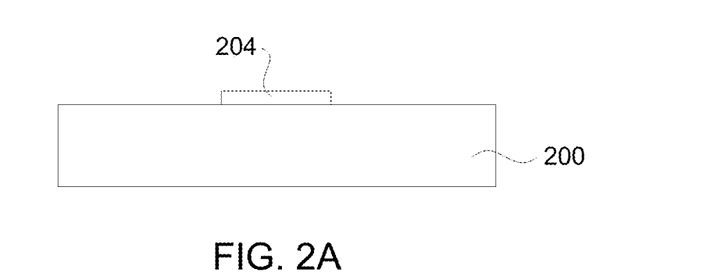
FIGS. 2A-2C are diagrams detailing a product marking process according to one embodiment of the invention.
Figure 2B:
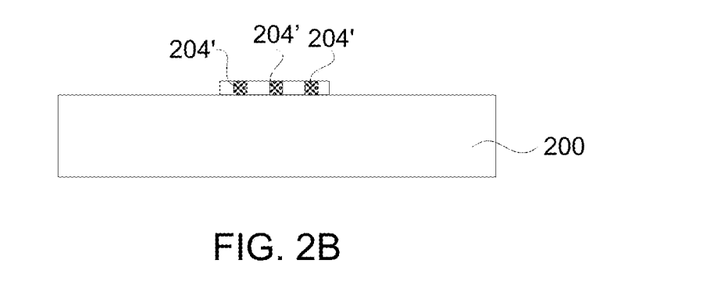
Figure 2C:
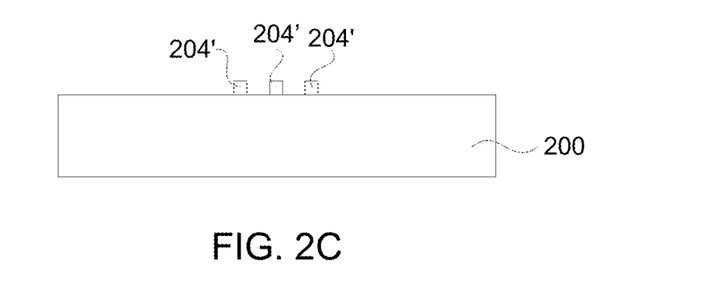

FIGS. 2A-2C are diagrams detailing a product marking process according to one embodiment of the invention. The product marking process shown in FIGS. 2A-2C pertains to one embodiment of the product marking process 100 illustrated in FIG. 1.

FIG. 2A is a diagram illustrating a housing portion 200. The housing portion 200 can represent a portion of a product housing, such as an outer housing of an electronic device. Deposited on the housing portion 200 is a layer of UV curable material 204. The layer of UV curable material 204 is a thin layer that can be deposited on a region of the housing portion 200. Through further processing the layer of UV curable material 204 is able to provide the desired product marking to the housing portion.

FIG. 2B is a diagram illustrating the housing portion 200 after selected portions of the layer of UV curable material 204 have been selectively cured. After the layer of UV curable material has been deposited on the housing portion 200, selective curing can be performed using a laser providing UV light. As shown in FIG. 2B, after the selective curing, the layer of UV curable material 204 is now converted to specific marking elements 204'. The specific marking elements 204' can pertain to text and/or graphic elements that are formed from cured portions of the layer of UV curable material 204.

FIG. 2C is a diagram illustrating the housing portion 200 after the remaining (unselected) portions of the layer of UV curable material 204 have been removed from the housing portion 200. For example, the remaining (unselected) portions of the layer of UV curable material 204 have been removed from the housing portion 200 through a rinsing operation. As shown in FIG. 2C, the specific marking elements 204' that have been formed in the layer of UV curable material 204 remain on the outer surface of the housing portion 200.

Optionally, a protective coating can be applied on the outer surface of the housing portion 200 over the specific marking elements 204' that have been formed in the layer of UV curable material 204. The protective coating can, for example, be translucent, such as clear acrylic.

Figure 3:
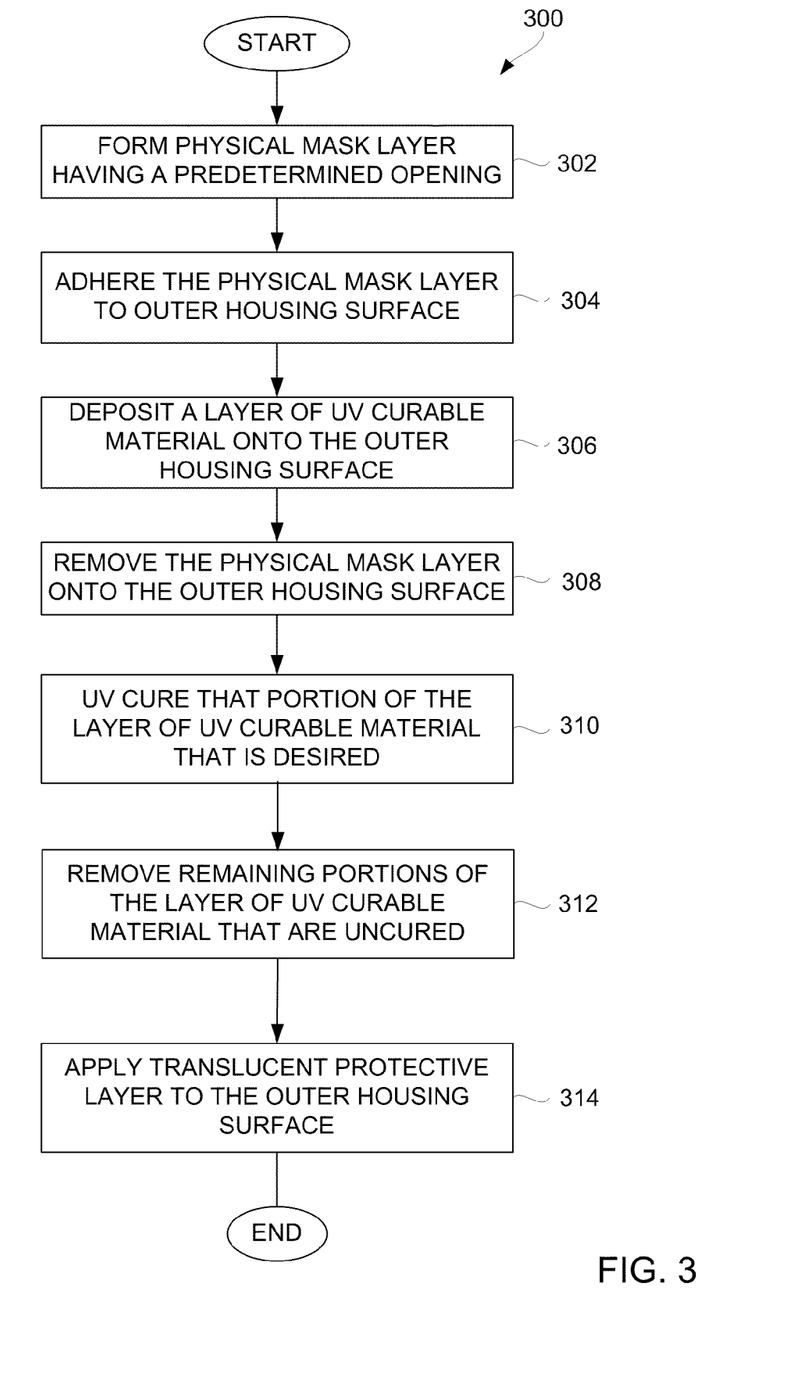
FIG. 3 is a process flow diagram for a product marking process according to another embodiment of the invention.

FIG. 3 is a process flow diagram for a product marking process 300 according to another embodiment of the invention. In this embodiment, the product marking process 300 can mark a housing of an electrical device. For example, the product marking process 300 can be used to form text and/or graphics onto a housing surface, such as an outer housing surface, of an electrical device (e.g., portable electronic device).

The product marking process 300 can initially form 302 a physical mask layer having at least one predetermined opening. The predetermined opening is, for example, an opening that surrounds a region were text or graphics is to be applied to the outer housing surface. In other words, the predetermined opening is oversized as compared to the region where text or graphic is to be applied on the outer housing surface. In one implementation, the physical mask layer can, for example, be implemented by a film having at die cut for the predetermined opening. In the event that the physical mask layer has more than one predetermined opening, the physical mask layer can have a die cut for each of the predetermined openings.

After the physical mask layer has been formed 302, the physical mask layer can be adhered 304 to the outer housing surface. In one implementation, the physical mask layer can be adhered 304 to the outer housing surface through use of an adhesive. For example, the physical mask can have an adhesive backing.

Next, a layer of UV curable material can be deposited 306 onto the outer housing surface. For example, a spray or printing technique can be used to deposit 306 a layer of UV curable material onto the outer housing surface. The layer of UV curable material being deposited 306 is the material that is to form the marking on the housing surface. For example, the layer of UV curable material can be a layer of UV curable adhesive, such as a curable coating DYMAX Multi-Cure 9-20557 available from DYMAX Corporation of Torrington, Conn. Thereafter, the physical mask layer can be removed 308 from the outer housing surface.

After the physical mask layer has been removed 308, the product marking process 300 can UV cure 310 that portion of the layer of UV curable material that is desired to form the marking. The UV cure 310 can utilize a laser to precisely cure portions of the layer of UV curable material that has been deposited 306 onto the outer housing surface. The UV cure 310 can thus form specific graphical elements and/or text elements from the layer of UV curable material by UV cure 310 of those portions of the layer of material that are used to represent the desired graphical elements and/or textual elements that are to remain on the outer housing surface. In one implementation, the laser performing the UV cure 310 is a marking laser that produces ultra-violent light (e.g., 355 nanometer (NM) laser). Although various different lasers can be used, one supplier for making lasers is TRUMPF Inc. of Farmington, Conn. Through proper control of the laser, the UV cure 310 of desired portions of the layer of UV curable material can be selectively performed without damage to the surface of the outer surface housing.

After the UV cure 310 has been performed, those remaining portions of the layer of UV curable material that are uncured can be removed 312 from the outer housing surface. Hence, the portions of the layer of UV curable material that have been UV cured remain adhered to the outer housing surface, while those other portions that have not been UV cured are removed. A fluid can be use to rinse off the remaining portions of the layer of UV curable material that are uncured. The fluid can, for example, be water and/or a dissolvent (e.g., isopropyl alcohol).

Subsequently, a translucent protective layer can be applied 314 to the outer housing surface. Although the translucent protective layer is not required, the translucent protective layer can serve to protect the portion of the layer of UV curable material that is used to represent the one or more desired graphical elements and/or textual elements on the outer housing surface. For example, the translucent protective layer can be a layer of acrylic. After the translucent protective layer has been applied 314, the product marking process 300 can end.

It should be noted that the use of a physical mask in the product marking process 300 is optional. The physical mask serves to confine the area(s) where the layer of UV curable material is provided. Hence, in one embodiment, the product marking can be performed with simply operations 306, 310 and 312 of the product marking process 300.

FIGS. 4A-4F are diagrams detailing a product marking process according to one embodiment of the invention. The product marking process shown in FIGS. 4A-4F pertain to one embodiment of the product marking process 300 illustrated in FIG. 3.

Figure 4A:
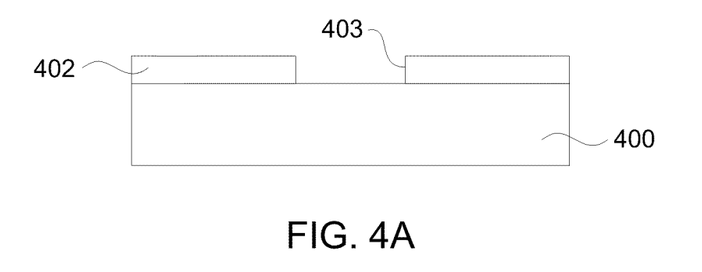
FIGS. 4A-4F are diagrams detailing a product marking process according to one embodiment of the invention.

FIG. 4A is a diagram illustrating a housing portion 400. The housing portion 400 can represent a portion of a product housing, such as an outer housing of an electronic device. A mask layer 402 is attached to the housing portion 400. The mask layer 402 has at least one predetermined opening 403 that defines a region where marking of the outer housing is to be performed.

Figure 4B:
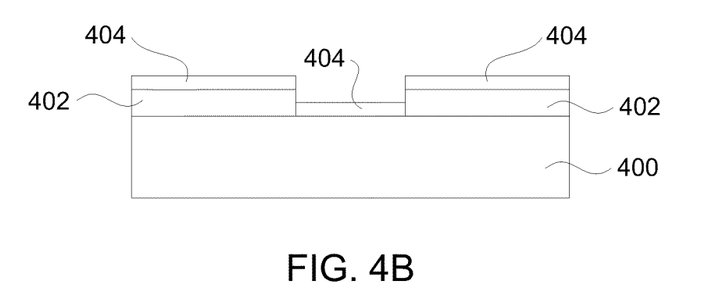

FIG. 4B is a diagram illustrating the housing portion 400 having the mask layer 402 as well as a layer of material 404. The layer of material 404 is applied over the predetermined opening 403 in the mask layer 402 and may also be applied over some or all of the mask layer 402. In one implementation, the material of the layer of UV curable material 404 is, for example, a thin layer of UV-curable adhesive. The layer of UV curable material can be applied is a spray-on liquid.

Figure 4C:
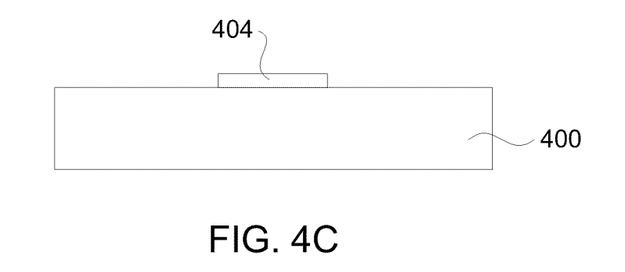

FIG. 4C is a diagram illustrating the housing portion 400 having a remaining portion of the layer of material 404 that results after the mask layer 402 is removed from the housing portion 400. The remaining portion of the layer of UV curable material 404 corresponds to the at least one predetermined opening 403 in the mask layer 402.

Figure 4D:
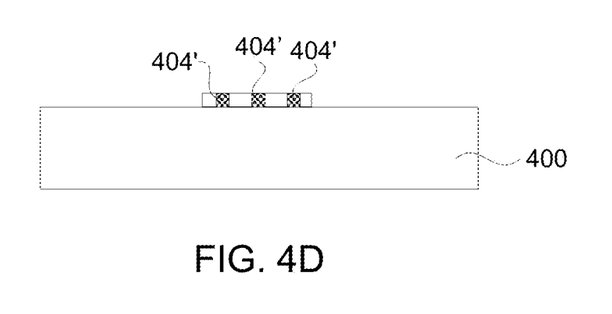

FIG. 4D is a diagram illustrating the housing portion 400 after selected portions of the layer of UV curable material 404 have been selectively cured. The selective curing can be performed using a laser providing UV light. The laser can have a small spot size (e.g., 10-30 microns) of the UV light to provide high resolution. As shown in FIG. 4D, after the selective curing, the layer of UV curable material 404 is now converted to specific marking elements 404'. The specific marking elements 404' can pertain to text and/or graphic elements that are formed from cured portions of the layer of UV curable material 404.

Figure 4E:
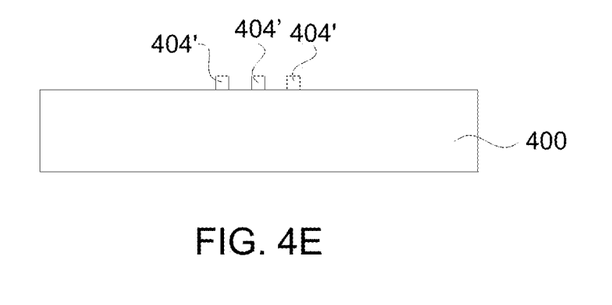

FIG. 4E is a diagram illustrating the housing portion 400 after the remaining (unselected) portions of the layer of UV curable material 404 have been removed from the housing portion 400. For example, the remaining (unselected) portions of the layer of UV curable material 404 have been removed from the housing portion 400 through a rinsing operation. The specific marking elements 404' that have been formed in the layer of UV curable material 404 remain on the outer surface of the housing portion 400.

Figure 4F:
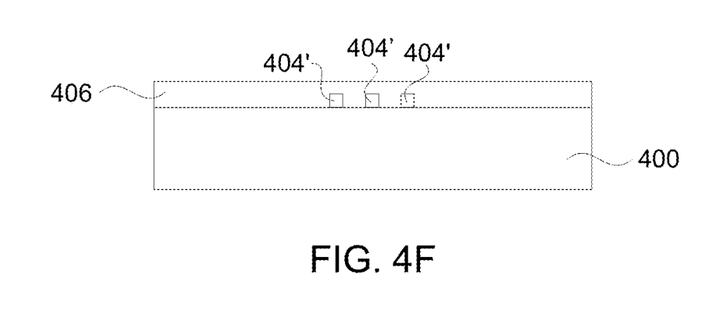

FIG. 4F is a diagram illustrating the housing portion 400 after a protective coating 406 is applied on the outer surface of the housing portion 400 over the specific marking elements 404' that have been formed in the layer of UV curable material 404.

Although embodiment discussed above can operate to selectively curing UV curable material using a laser providing UV light, it should be noted that UV light for curing can be provided by other UV light sources. Additionally, in some embodiments, deposited UV curable material can be cured using multiple different UV light sources. For example, a wide UV light source (e.g., flood light) can be used to cure a large area, while for small marking features a narrow UV light source (e.g., UV laser) can be used.

Figure 5A:
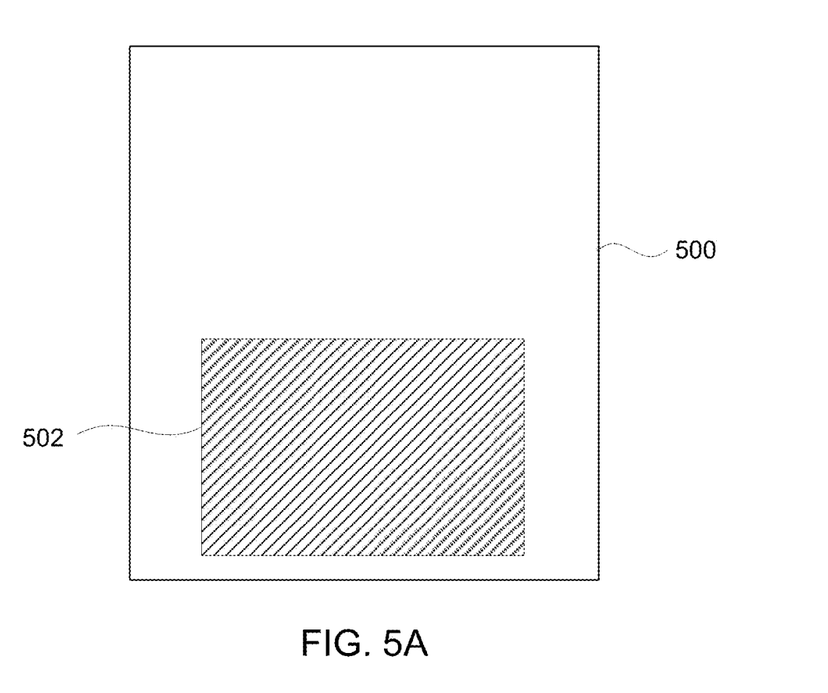
FIGS. 5A and 5B are diagrams illustrating exemplary marking of a product in accordance with a product marking process.
Figure 5B:
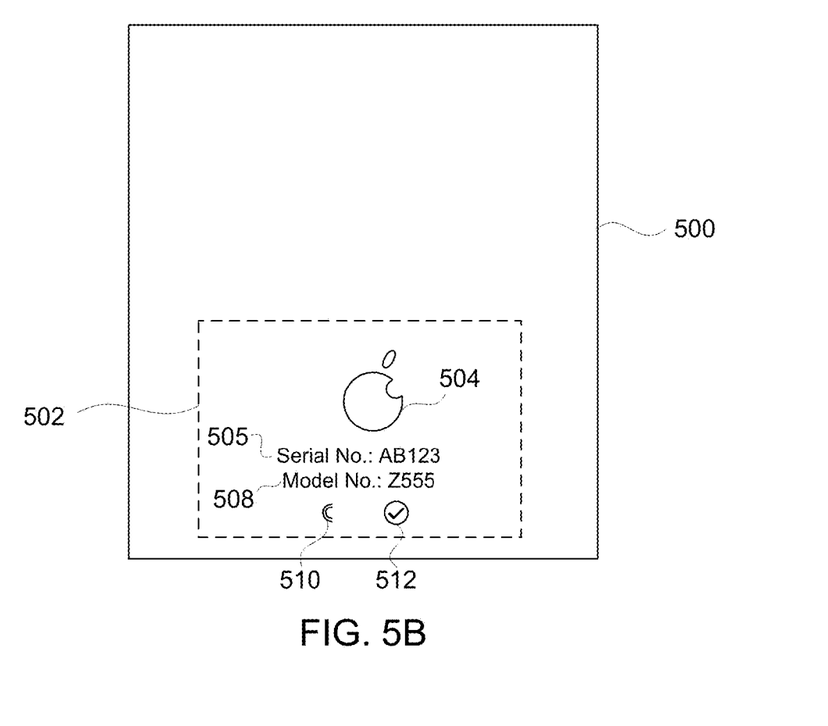

FIGS. 5A and 5B are diagrams illustrating exemplary marking of a product in accordance with a product marking process, such as the product marking process shown in FIGS. 4A-4F of the product marking process 400 illustrated in FIG. 4.

FIG. 5A illustrates a product housing 500 according to one embodiment. The product housing 500 being illustrated can represent one surface, such as back surface, of a handheld electronic device. A predetermined region 502 of the illustrated surface can be coated or covered with a layer of material to be used for marking (e.g., UV curable material). As noted above, a masking layer can be used to confine the layer of material to the predetermined region 502.

FIG. 5B illustrates the product housing 500 after the layer of material in the predetermined region 502 has been further processed (e.g., curing and rinsing) to yield the desired labeling. In this example, the labeling includes a logo graphic 504, serial number 506, model number 508, and certification/approval marks 510 and 512.

Although UV curing is primarily discussed above, other curing can be performing. For example, infrared (IR) light can be used to cure an IR curable material in much the same manner that an IT curable material is cured by UV light. IR curing uses heat generated by IR light to cure the IR curing material. An IR laser can produce the IR light. Through process control (e.g., pulse-width, intensity, etc.), the amount of IR light being deposed can be controlled. Further, in one embodiment, curing can be provided by a combination of UV curing and IR curing. For example, a laser source could output either or both of UV light and IR light. With both UV and IR light sources, the curing may be efficiently performed by controlling not only UV light but also IR light so that the curing material can be heated as appropriate while being US cured.

In some embodiments it may be desirable to use ablation to at least partially form the product marking. For example, in one embodiment, at least a portion of the cured UV curable material that has been cured on a product surface can be further ablated (e.g., using a laser). The ablation can, for example, be used to assist in forming detailed and precise text and/or graphics for the product marking. Additional details on using ablation for forming product marking are provided in U.S. Provisional Patent Application No. 61/121, 491 which is incorporated herein by reference below.

In one embodiment, the product marking techniques discussed herein can be used to provide markings on a portable electronic device. The portable electronic device can further be a handheld electronic device. The term handheld generally means that the electronic device has a form factor that is small enough to be comfortably held in one hand. Typically, a handheld electronic device is less than one (1) pound in weight. A hand-held electronic device may be directed at one-handed operation or two-handed operation. In one-handed operation, a single hand is used to both support the device as well as to perform operations with the user interface during use. In two-handed operation, one hand is used to support the device while the other hand performs operations with a user interface during use or alternatively both hands support the device as well as perform operations during use. In some cases, the hand-held electronic device is sized for placement into a pocket of the user. By being pocket-sized, the user does not have to directly carry the device and therefore the device can be taken almost anywhere the user travels (e.g., the user is not limited by carrying a large, bulky and often heavy device).

This application references or incorporates: (i) U.S. Provisional Patent Application No. 61/059,789, filed Jun. 8, 2008, and entitled "Methods and Systems for Manufacturing an Electronic Device," which is hereby incorporated herein by reference; and (ii) U.S. Provisional Patent Application No. 61/121,491, filed Dec. 10, 2008, and entitled "Techniques for Marking Product Housings," which is hereby incorporated herein by reference.

The various aspects, features, embodiments or implementations of the invention described above can be used alone or in various combinations.

Aspects, embodiments or implementations described herein may provide high precision marking for product housings. As an example, the marking being provided can have a resolution whereby thirty (30) micron line widths can be achieved. Aspects, embodiments or implementations described herein may provide marking techniques effective for surfaces that are flat or curved. Aspects, embodiments or implementations described herein may also provide marking techniques having good adhesion characteristics to product housings, such as plastic housings. Aspects, embodiments or implementations described herein may provide one or several markings to one or more distinct areas of a product's housing. The various markings can be efficiently provided in a sequential or concurrent manner. The various marking can also use a single color or a plurality of colors. In some embodiments, if multiple colors are to be used in the markings, the processing can be repeated for each of the colors to be provided.

The many features and advantages of the present invention are apparent from the written description. Further, since numerous modifications and changes will readily occur to those skilled in the art, the invention should not be limited to the exact construction and operation as illustrated and described. Hence, all suitable modifications and equivalents may be resorted to as falling within the scope of the invention.

What is claimed is:

1. A method for depositing material to selected regions of an electronic device housing, said method comprising:

depositing a layer of UV curable material onto a housing surface;

curing select portions of the layer of UV curable material by directing UV light from a UV laser onto the select portions of the layer of UV curable material on the housing surface, the select portions having a marking with a line width that is determined by a spot size of the UV laser; and removing, subsequent to the curing, remaining portions of the layer of UV curable material that have not been cured by said curing.

2. The method as recited in claim 1, wherein said method further comprises:

subsequently applying a translucent protective layer to the housing surface so as to cover at least the select portions of the layer of UV curable material that have been cured on the housing surface.

3. The method as recited in claim 1, wherein the select portions of the layer of UV curable material retained on the housing surface include text and graphics, and the spot size of the UV laser has a diameter of between about 10 microns and 30 microns.

4. The method as recited in claim 1, wherein the select portions of the layer of UV curable material retained on the housing surface include at least one graphic, the at least one graphic being a logo, a certification mark or an approval mark.

5. The method as recited in claim 1, wherein the layer of material is a layer of UV curable adhesive.

6. The method as recited in claim 1, wherein said depositing the layer of UV curable material onto the housing surface comprises spraying the layer of UV curable material onto the housing surface.

7. The method as recited in claim 1, wherein the electronic device housing is a handheld electronic device.

8. The method as recited in claim 1, wherein the housing surface is an outer housing surface.

9. The method as recited in claim 1, wherein the color of the UV curable material can be controlled using a dye additive.

10. A method for depositing material to selected regions of an electronic device housing, said method comprising:

depositing a layer of UV curable material onto a housing surface of the electronic device housing; and directing UV light from a UV laser onto select portions of the layer of UV curable material on the housing surface to thereby cure the select portions of the of the layer of UV curable material that are to remain on the housing surface, the select portions having a marking with a line width that is determined by a spot size of the UV laser.

11. The method as recited in claim 10, wherein said method further comprises:

removing any portions of the layer of UV curable material that have not been cured; and subsequently applying a translucent protective layer to the housing surface so as to cover at least the select portions of the layer of UV curable material that have been cured on the housing surface.

12. A product marking process to mark a housing for an electrical device, said process comprising:

depositing a layer of UV curable material onto an outer housing surface;

curing portions of the UV curable material by directing a UV laser along the UV curable material to define a marking, the marking having a feature that is determined by a spot size of the UV laser; and subsequent to curing the UV curable material, removing portions of the layer of UV curable material that were not cured using the UV laser.

13. The process of claim 12, wherein said process further comprises:

subsequent to the removing, applying a translucent protective layer to the outer housing surface to cover the marking formed from the layer of UV curable material that have been UV cured on the outer housing surface.

14. The process of claim 12, wherein:

the marking formed by UV curing the UV curable material include at least one of text or graphics; and the feature is a line width of the at least one of text or graphics.

15. The process of claim 12, wherein the marking formed by UV curing the UV curable material include at least one graphic, the at least one graphic being a logo, a certification mark or an approval mark.

16. The process of claim 12, wherein the layer of UV curable material is a layer of adhesive that is UV curable.

17. The process of claim 12, wherein depositing the layer of UV curable material onto the outer housing surface comprises spraying the layer of UV curable material onto the outer housing surface.

18. The process of claim 12, wherein the electrical device is a portable electronic device.

* * * * *

UNITED STATES PATENT AND TRADEMARK OFFICE
CERTIFICATE OF CORRECTION

PATENT NO.        : 9,884,342 B2
APPLICATION NO.   : 12/569810
DATED             : February 6, 2018
INVENTOR(S)       : Michael Nashner Page 1 of 1

It is certified that error appears in the above-identified patent and that said Letters Patent is hereby corrected as shown below:

On the Title Page

In Column 1, at (75), delete "Nasher" and insert --Nashner--.

Signed and Sealed this
Nineteenth Day of June, 2018

Andrei Iancu
*Director of the United States Patent and Trademark Office*